(12) United States Patent
Komura (10) Patent No.: US 11,495,739 B2
(45) Date of Patent: Nov. 8, 2022

(54) MAGNETORESISTANCE EFFECT ELEMENT AND MAGNETIC RECORDING ARRAY

(71) Applicant: TDK CORPORATION, Tokyo (JP)

(72) Inventor: Eiji Komura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 147 days.

(21) Appl. No.: 16/981,425

(22) PCT Filed: Dec. 23, 2019

(86) PCT No.: PCT/JP2019/050248
§ 371 (c)(1),
(2) Date: Sep. 16, 2020

(87) PCT Pub. No.: WO2021/130796
PCT Pub. Date: Jul. 1, 2021

(65) Prior Publication Data
US 2021/0249590 A1    Aug. 12, 2021

(51) Int. Cl.
*H01L 43/08* (2006.01)
*G11B 5/39* (2006.01)
(Continued)

(52) U.S. Cl.
CPC ............ *H01L 43/08* (2013.01); *G11B 5/3906* (2013.01); *G11C 5/06* (2013.01); *G11C 11/161* (2013.01);
(Continued)

(58) Field of Classification Search
CPC ......... H01L 43/08; H01L 43/02; H01L 43/10; G11B 5/3906; G11C 5/06; G11C 11/161; G11C 11/1673; G11C 11/1675
(Continued)

(56) References Cited

U.S. PATENT DOCUMENTS

| 8,350,347 B2 | 1/2013 | Gaudin et al. |
| 2008/0067546 A1* | 3/2008 | Murata ............... H01L 29/7787 257/E23.105 |

(Continued)

FOREIGN PATENT DOCUMENTS

| JP | 2017-216286 A | 12/2017 |
| JP | 2018-093069 A | 6/2018 |

(Continued)

OTHER PUBLICATIONS

Y. K. Kato, et al. "Observation of the Spin Hall Effect in Semiconductors", Science, vol. 306, pp. 1910-1913, 2004.

(Continued)

*Primary Examiner* — Jami Valentine Miller
(74) *Attorney, Agent, or Firm* — Oliff PLC (57) ABSTRACT

A magnetoresistance effect element according to an embodiment includes: a spin orbit torque wiring extending in a first direction; a laminated body laminated on the spin orbit torque wiring and having a first ferromagnetic layer, a second ferromagnetic layer, and a non-magnetic layer between the first ferromagnetic layer and the second ferromagnetic layer; a conductive layer in contact with a side of the laminated body opposite to the spin orbit torque wiring; and a heat dissipation layer separated from the laminated body in the first direction and connected to the spin orbit torque wiring and the conductive layer.

12 Claims, 8 Drawing Sheets

(51) Int. Cl.
  *G11C 5/06* (2006.01)
  *G11C 11/16* (2006.01)
  *H01L 43/02* (2006.01)
  *H01L 43/10* (2006.01)

(52) U.S. Cl.
  CPC ...... *G11C 11/1673* (2013.01); *G11C 11/1675* (2013.01); *H01L 43/02* (2013.01); *H01L 43/10* (2013.01)

(58) Field of Classification Search
  USPC ........................................................ 257/421
  See application file for complete search history.

(56) References Cited

U.S. PATENT DOCUMENTS

| | | | |
|---|---|---|---|
| 2015/0348606 A1 | 12/2015 | Buhrman et al. | |
| 2017/0222135 A1 | 8/2017 | Fukami et al. | |
| 2018/0159024 A1 | 6/2018 | Buyandalai et al. | |
| 2019/0074043 A1* | 3/2019 | Sasaki | G01R 33/098 |
| 2020/0106004 A1* | 4/2020 | Komura | G11C 11/161 |
| 2020/0266336 A1* | 8/2020 | Nakada | H01L 43/02 |
| 2021/0151665 A1* | 5/2021 | Komura | H01L 27/222 |

FOREIGN PATENT DOCUMENTS

| | | |
|---|---|---|
| JP | 2019-047118 A | 3/2019 |
| JP | 6551594 B1 | 7/2019 |
| WO | 2016/021468 A1 | 2/2016 |

OTHER PUBLICATIONS

I. M. Miron et al., "Perpendicular switching of a single ferromagnetic layer induced by in-plane current injection" Nature, vol. 476, pp. 189-194, 2011.
L. Liu et al., "Spin torque switching with the giant spin Hall effect of tantalum" Science, vol. 336, pp. 555, 2012.
L. Liu et al., "Current-Induced Switching of Perpendiculary Magnetized Magnetic Layers Using Spin Torque from the Spin Hall Effect" Physical Review Letters, vol. 109, pp. 096602-1-096602-5, 2012.
KS. Lee et al., "Threshold current for switching of a perpendicular magnetic layer induced by spin Hall effect" vol. 102, pp. 1-18, 2013.
KS. Lee et al., :Thermally activated switching of perpendicular magnet by spin-orbit spin torque Applied Physics Letters, vol. 104, pp. 072413-1-072414-5, 2014.
S. Fukami et al., Magnetization switching by spin-orbit torque in an antiferromagnet-ferromagnet bilayer system Nature Materials, vol. 15, pp. 535-541, 2016.
S. Fukami et al., "A spin-orbit torque switching scheme with collinear magnetic easy axis and current configuration" Nature Nanotechnology, DOI:10.1038/NNANO, pp. 1-6, 2016.
S. Takahashi et al., "Spin injection and detection in magnetic nanostructures" Physical Review B 67, pp. 052409-1-052409-4, 2003.
Y. Seo et al., "Area-Efficient SOT-MRAM With a Schottky Diode" vol. 37, No. 8, pp. 982-985, 2016.

* cited by examiner

MAGNETORESISTANCE EFFECT ELEMENT AND MAGNETIC RECORDING ARRAY

TECHNICAL FIELD

The present invention relates to a magnetoresistance effect element and a magnetic recording array.

BACKGROUND ART

Giant magnetoresistance (GMR) elements formed of a multilayer film constituted of a ferromagnetic layer and a non-magnetic layer and a tunneling magnetoresistance (TMR) element utilizing an insulating layer (a tunnel barrier layer or a barrier layer) for a non-magnetic layer are known as magnetoresistance effect elements. Magnetoresistance effect elements can be applied to magnetic sensors, high frequency components, magnetic heads, and nonvolatile random access memories (MRAMs).

MRAMs are memory elements in which magnetoresistance effect elements are integrally formed. MRAMs read and write data by utilizing the characteristics in which, if directions of the magnetization of two ferromagnetic layers having a non-magnetic layer disposed therebetween in the magnetoresistance effect elements change, the resistance of the magnetoresistance effect element changes. A direction of the magnetization of a ferromagnetic layer is controlled, for example, using a magnetic field caused by a current. Furthermore, for example, a direction of the magnetization of a ferromagnetic layer is controlled using a spin transfer torque (STT) occurring when a current flows in a direction in which the magnetoresistance effect element is laminated.

When a direction of the magnetization of a ferromagnetic layer is rewritten using an STT, a current flows in a direction in which the magnetoresistance effect element is laminated. A write current causes deterioration of the characteristics of a magnetoresistance effect element.

In recent years, attention has been focused on methods in which a current is not required to flow in a direction in which the magnetoresistance effect element is laminated at the time of writing. One of the methods is a writing method in which a spin orbit torque (SOT) is used (for example, Patent Document 1). An SOT is induced due to a spin current generated through a spin-orbit interaction or a Rashba effect at an interface between different materials. A current for inducing an SOT in a magnetoresistance effect element flows in a direction crossing a direction in which the magnetoresistance effect element is laminated. That is to say, the magnetoresistance effect element does not require a current to flow in the direction in which the magnetoresistance effect element is laminated and an increase in lifespan of such a magnetoresistance effect element can be expected.

CITATION LIST

Patent Document

[Patent Document 1]
Japanese Unexamined Patent Application, First Publication No. 2017-216286

SUMMARY

Technical Problem

In order to obtain a large SOT, it is necessary to utilize a material that cause strong spin-orbit interaction for a wiring. For example, it has been reported that heavy metals such as Ta and W are materials having large spin Hall angles and causing strong spin-orbit interaction. However, such heavy metals have a large electrical resistance and serve as a heat source. The heat generated in a wiring reduces the stability of the magnetization of the magnetoresistance effect element and causes the reliability of the stored data to decrease.

The present invention has been realized in view of the above circumstances, and an object of the present invention is to provide a magnetoresistance effect element and a magnetic recording array in which the reliability of data is able to be improved.

Solution to Problem

In order to achieve the above object, the present invention provides the following means.

(1) A magnetoresistance effect element according to a first aspect includes: a spin orbit torque wiring extending in a first direction; a laminated body laminated on the spin orbit torque wiring and having a first ferromagnetic layer, a second ferromagnetic layer, and a non-magnetic layer between the first ferromagnetic layer and the second ferromagnetic layer; a conductive layer in contact with a side of the laminated body opposite to the spin orbit torque wiring; and a heat dissipation layer separated from the laminated body in the first direction and connected to the spin orbit torque wiring and the conductive layer.

(2) The magnetoresistance effect element according to the aspect may further include: an insulating layer between the laminated body and the heat dissipation layer, wherein the thermal conductivity of the heat dissipation layer may be higher than the thermal conductivity of the insulating layer.

(3) In the magnetoresistance effect element according to the aspect, when viewed in a plan view from a direction in which the laminated body is laminated, the heat dissipation layer may be separated from the laminated body in a second direction intersecting with the first direction.

(4) The magnetoresistance effect element according to the aspect may further include: a first wiring and a second wiring having the laminated body arranged therebetween in the first direction when viewed in a plan view from the direction in which the laminated body is laminated and connected to the spin orbit torque wiring.

(5) In the magnetoresistance effect element according to the aspect, the heat dissipation layer may be in contact with the first wiring and the second wiring.

(6) In the magnetoresistance effect element according to the aspect, the length of a first path from an end portion of the first wiring in the first direction to the conductive layer via the laminated body may be longer than a distance of a second path from the end portion to the conductive layer via the heat dissipation layer.

(7) In the magnetoresistance effect element according to the aspect, the heat dissipation layer may include any selected from the group consisting of SiN, AlN, and MgO.

(8) In the magnetoresistance effect element according to the aspect, a contact surface between the heat dissipation layer and the spin orbit torque wiring may be inclined with respect to the direction in which the laminated body is laminated.

(9) In the magnetoresistance effect element according to the aspect, the heat dissipation layer may cover a part of a surface of the conductive layer opposite to a surface thereof in contact with the laminated body.

(10) In the magnetoresistance effect element according to the aspect, the heat dissipation layer may be in contact with a surface of the spin orbit torque wiring in contact with the laminated body.

(11) In the magnetoresistance effect element according to the aspect, the heat dissipation layer may be one continuous layer.

(12) A magnetic recording array according to a second aspect includes: a plurality of the magnetoresistance effect elements according to these aspects.

Advantageous Effects

The magnetoresistance effect elements and a magnetic recording array according to an embodiment can improve the reliability of data.

DESCRIPTION OF EMBODIMENTS

An embodiment will be described in detail below with reference to the drawings as appropriate. In the drawings used in the following description, in order to facilitate understanding of the features of the embodiment, for the sake of convenience, enlarged characteristic portions are illustrated in some cases and dimensional ratios between the constituent elements and the like may be different from the actual dimensional ratios in some cases. The materials, dimensions, and the like exemplified in the following description are merely examples, the present invention is not limited thereto, and the present invention can be appropriately modified and implemented within the range in which the effects of the present invention are exhibited.

First, directions will be defined. One direction on one surface of a substrate Sub (refer to FIG. 2) which will be described later is defined as an x direction and a direction orthogonal to the x direction is defined as a y direction. The x direction is a direction in which a spin orbit torque wiring 20 which will be described later extends and is a length direction of the spin orbit torque wiring 20. The x direction is an example of a first direction. The y direction is an example of the second direction. A z direction is a direction orthogonal to the x direction and the y direction. The z direction is an example of a lamination direction. A +z direction may be expressed as an "upward direction" and a −z direction may be expressed as a "downward direction" in some cases. The upward and downward directions do not necessarily correspond to a direction in which gravity acts.

In this specification, the expression "extending in the x direction" means, for example, the fact that a dimension in the x direction is larger than a minimum dimension among the dimension in the x direction, a dimension in the y direction, and a dimension in the z direction. The same applies to the case of the expressions "extending in other directions." Furthermore, in this specification, the term "connection" is not limited to the case of being physically connected. For example, "connection" is not limited to the case in which two layers are physically in contact with each other and a case in which two layers are connected while another layer is arranged between the two layers is also included in "connection." In addition, a case in which two members are electrically connected is also be included in "connection."

First Embodiment

Figure 1:
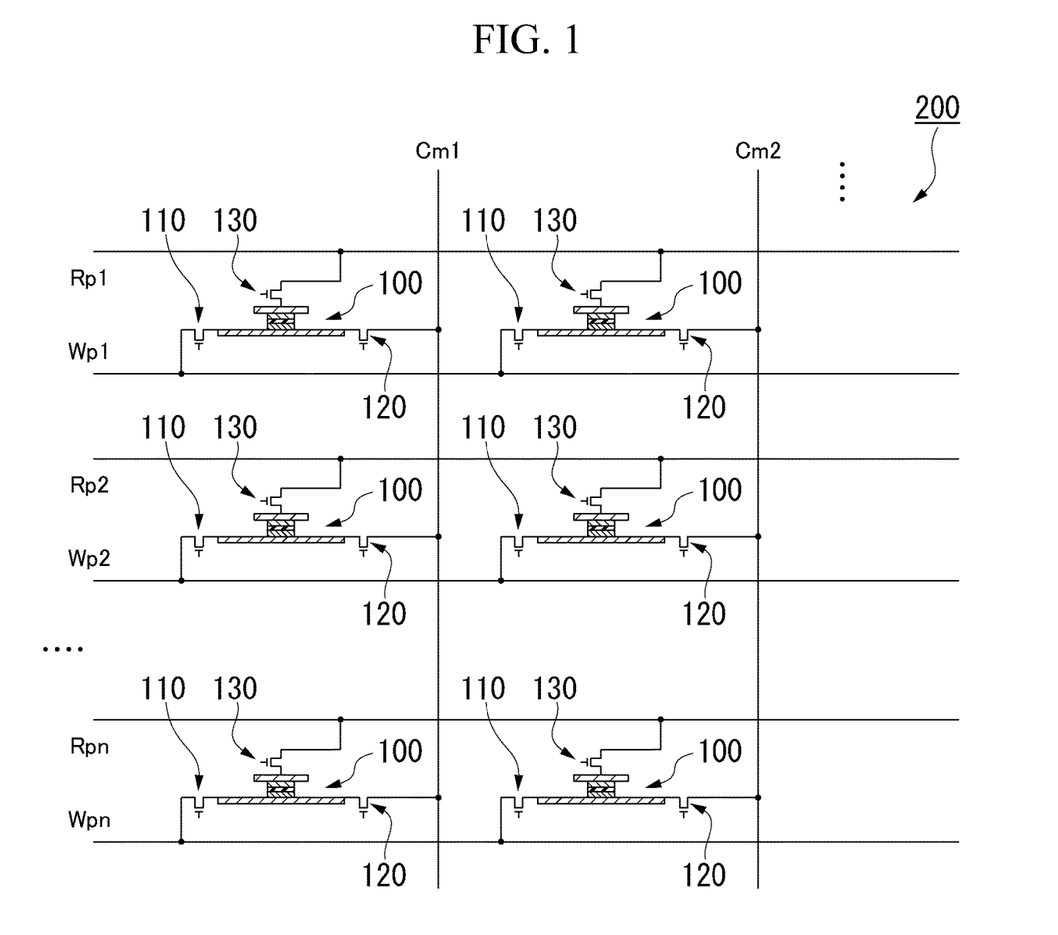
FIG. 1 is a schematic diagram of a magnetic recording array according to a first embodiment.

FIG. 1 is a constitution diagram of a magnetic recording array 200 according to a first embodiment. The magnetic recording array 200 includes a plurality of magnetoresistance effect elements 100, a plurality of write wirings Wp1 to Wpn, a plurality of common wirings Cm1 to Cmn, a plurality of read wirings Rp1 to Rpn, a plurality of first switching elements 110, a plurality of second switching elements 120, and a plurality of third switching elements 130. The magnetic recording array 200 can be used, for example, in a magnetic memory or the like.

The write wirings Wp1 to Wpn electrically connect a power supply to one or more magnetoresistance effect elements 100. The common wirings Cm1 to Cmn are wirings used both at the time writing data and at the time of reading data. The common wirings Cm1 to Cmn electrically connect a reference potential to the one or more magnetoresistance effect elements 100. The reference potential is, for example, the ground. The common wirings Cm1 to Cmn may be provided in each of the plurality of magnetoresistance effect elements 100 or may be provided across the plurality of magnetoresistance effect elements 100. The read wirings Rp1 to Rpn electrically connect the power supply to the one or more magnetoresistance effect elements 100. The power supply is connected to the magnetic recording array 200 at the time of use.

The first switching element 110, the second switching element 120, and the third switching element 130 illustrated in FIG. 1 are connected to each of the magnetoresistance effect elements 100. The first switching element 110 is connected between the magnetoresistance effect element 100 and the write wiring Wp1 to Wpn. The second switching element 120 is connected between the magnetoresistance effect element 100 and the common wiring Cm1 to Cmn. The third switching element 130 is connected between the magnetoresistance effect element 100 and the read wiring Rp1 to Rpn.

When the first switching element 110 and the second switching element 120 are turned on, a write current flows between write wiring Wp1 to Wpn and common wiring Cm1 to Cmn connected to a predetermined magnetoresistance effect element 100. When the second switching element 120 and the third switching element 130 are turned on, a read current flows between common wiring Cm1 to Cmn and read wiring Rp1 to Rpn connected to a predetermined magnetoresistance effect element 100.

The first switching elements 110, the second switching elements 120, and the third switching elements 130 are elements configured to control a flow of a current. The first switching elements 110, the second switching elements 120, and the third switching elements 130 are, for example, transistors, elements such as ovonic threshold switches (OTSs) in which a change in phase of a crystal layer is utilized, elements such as metal-insulator transition (MIT) switches in which a change in band structure is utilized, elements such as Zener diodes and avalanche diodes in which a breakdown voltage is utilized, and elements in which conductivity changes along with a change in atomic position.

Any of the first switching elements 110, the second switching elements 120, and the third switching elements 130 may be shared by the magnetoresistance effect elements 100 connected to the same wiring. For example, when any of the first switching elements 110 is shared, one first switching element 110 is provided upstream of the write wirings Wp1 to Wpn. For example, when any of the second switching elements 120 is shared, one of the second switching elements 120 is provided upstream of the common wirings Cm1 to Cmn. For example, when any of the third switching elements 130 is shared, one of the third switching elements 130 is provided upstream of the read wirings Rp1 to Rpn.

Figure 2:
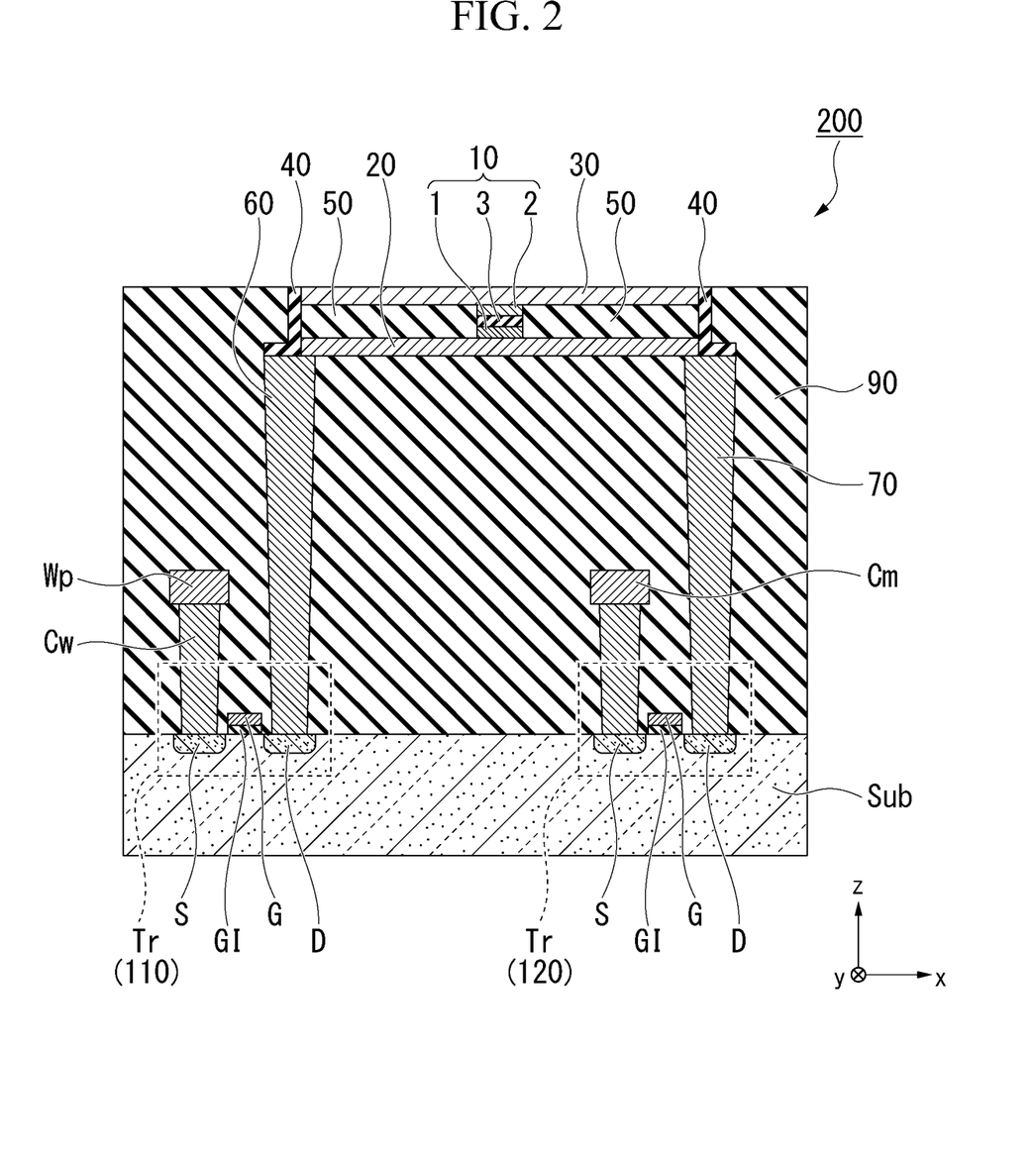
FIG. 2 is a cross-sectional view of a characteristic part of the magnetic recording array according to the first embodiment.

FIG. 2 is a cross-sectional view of a main part of the magnetic recording array 200 according to the first embodiment. FIG. 2 is a cross section of the magnetoresistance effect elements 100 taken along an xz plane passing through the center of the width of the spin orbit torque wiring 20 which will be described later in the y direction.

The first switching element 110 and the second switching element 120 illustrated in FIG. 2 serve as transistors Tr. The third switching element 130 is electrically connected to a conductive layer 30 and is located, for example, in the y direction in FIG. 2. Each of the transistors Tr is, for example, a field effect transistor and has a gate electrode G, a gate insulating film GI, and a source S and a drain D formed on a substrate Sub. The substrate Sub is, for example, a semiconductor substrate.

The transistors Tr and the magnetoresistance effect elements 100 are electrically connected to each other via a first wiring 60 or a second wiring 70. Furthermore, the transistors Tr and the write wirings Wp or the common wirings Cm are connected through conductive sections Cw. The first wiring 60, the second wiring 70, and the conductive sections Cw may be referred to as, for example, connection wirings or via wirings in some cases. The first wiring 60, the second wiring 70, and the conductive sections Cw include a material having conductivity. The first wiring 60, the second wiring 70, and the conductive sections Cw extend, for example, in the z direction.

The periphery of the magnetoresistance effect elements 100 and the transistors Tr is covered with an insulating layer 90. The insulating layer 90 is an insulating layer configured to insulate between wirings of a multilayer wiring and between elements. The insulating layer 90 may be formed of, for example, silicon oxide (SiOx), silicon nitride (SiNx), silicon carbide (SiC), chromium nitride, silicon carbonitride (SiCN), silicon oxynitride (SiON), aluminum oxide ($Al_2O_3$), zirconium oxide (ZrOx), or the like.

Figure 3:
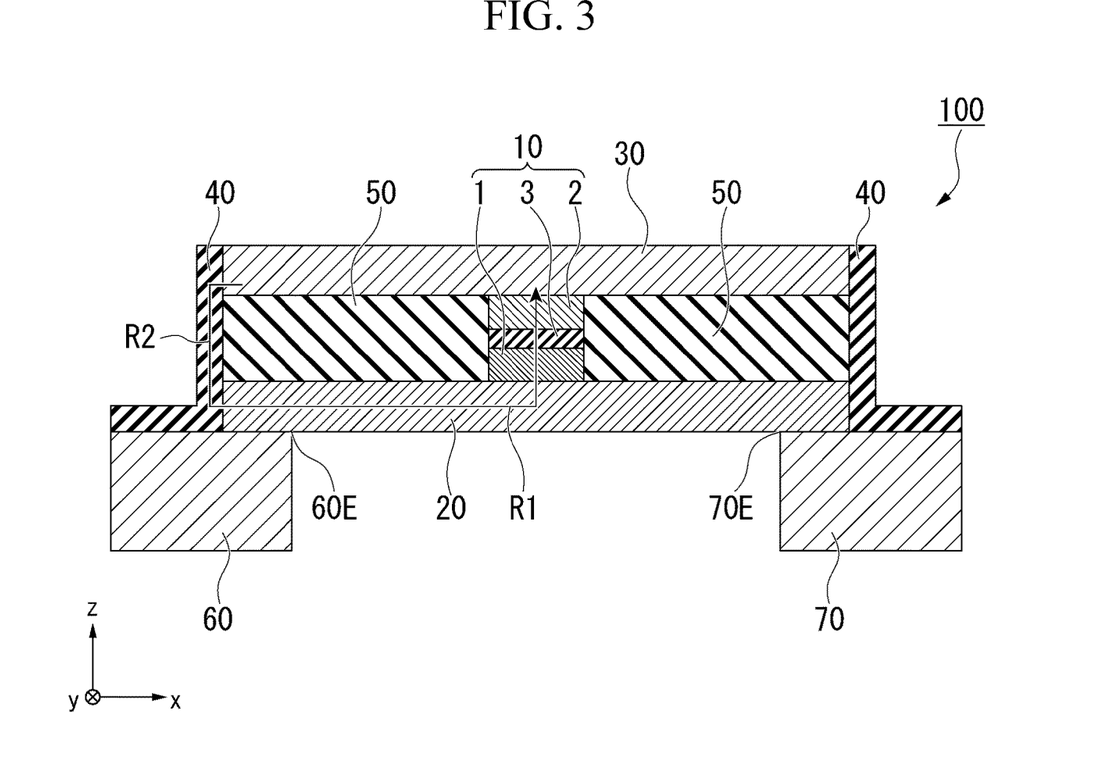
FIG. 3 is a cross-sectional view of a magnetoresistance effect element according to the first embodiment.
Figure 4:
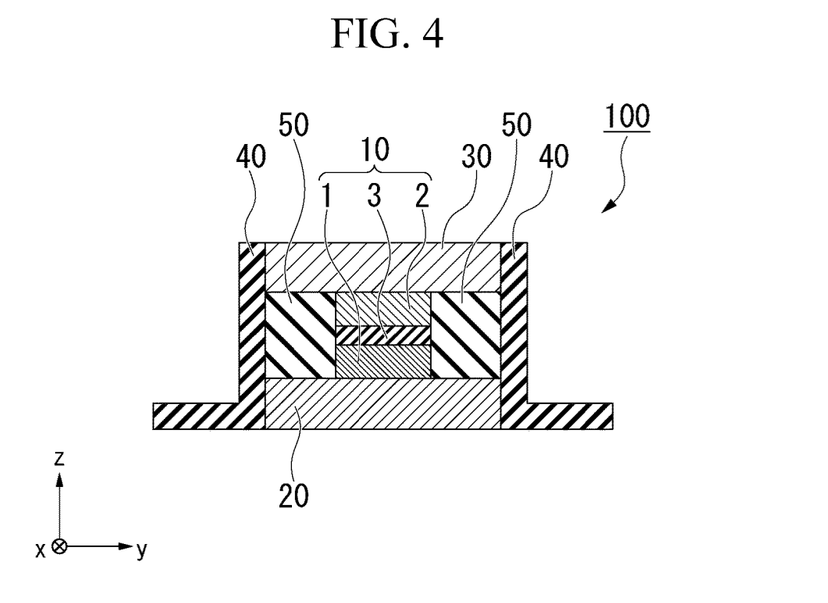
FIG. 4 is another cross-sectional view of the magnetoresistance effect element according to the first embodiment.

FIG. 3 is a cross-sectional view of the magnetoresistance effect element 100 according to the first embodiment. FIG. 4 is another cross-sectional view of the magnetoresistance effect element 100 according to the first embodiment. FIG. 3 is a cross section of the magnetoresistance effect element 100 taken along the xz plane passing through the center of the width of the spin orbit torque wiring 20 in the y direction. FIG. 4 is a cross section of the magnetoresistance effect element 100 taken along a yz plane passing through the center of the length of the spin orbit torque wiring 20 in the x direction.

Each of the magnetoresistance effect elements 100 includes a laminated body 10, the spin orbit torque wiring 20, the conductive layer 30, a heat dissipation layer 40, an insulating layer 50, the first wiring 60, and the second wiring 70. A resistance value of the laminated body 10 in the z direction changes when spins are injected from the spin orbit torque wiring 20 into the laminated body 10. The magnetoresistance effect element 100 is a magnetic element in which a spin orbit torque (SOT) is utilized and may be referred to as a "spin orbit torque type magnetoresistance effect element," a "spin injection type magnetoresistance effect element," or a "spin current magnetoresistance effect element" in some cases.

The laminated body 10 is laminated on the spin orbit torque wiring 20. Another layer may be provided between the laminated body 10 and the spin orbit torque wiring 20. The laminated body 10 is disposed between the spin orbit torque wiring 20 and the conductive layer 30 in the z direction. The laminated body 10 is a columnar body. A shape of the laminated body 10 when viewed in a plan view from the z direction is, for example, a circle, an ellipse, or a quadrangle.

The laminated body 10 has a first ferromagnetic layer 1, a second ferromagnetic layer 2, and a non-magnetic layer 3. For example, the first ferromagnetic layer 1 is in contact with the spin orbit torque wiring 20 and is laminated on the spin orbit torque wiring 20. Spins are injected from the spin orbit torque wiring 20 into the first ferromagnetic layer 1. The magnetization of the first ferromagnetic layer 1 receives a spin orbit torque (SOT) due to the injected spins and an orientation direction thereof changes. The second ferromagnetic layer 2 is in the z direction from the first ferromagnetic layer 1. The non-magnetic layer 3 is disposed between the first ferromagnetic layer 1 and the second ferromagnetic layer 2 in the z direction.

The first ferromagnetic layer 1 and the second ferromagnetic layer 2 each have magnetization. An orientation direction of the magnetization of the second ferromagnetic layer 2 is less likely to change than that of the magnetization of the first ferromagnetic layer 1 when having a predetermined applied external force. The first ferromagnetic layer 1 may be referred to as a "magnetization free layer" and the second ferromagnetic layer 2 may be a "magnetization fixed layer" and a "magnetization reference layer" in some cases. A resistance value of the laminated body 10 changes in accordance with a difference in relative angle of magnetization between the first ferromagnetic layer 1 and the second ferromagnetic layer 2 which have the non-magnetic layer 3 disposed therebetween.

The first ferromagnetic layer 1 and the second ferromagnetic layer 2 include ferromagnetic materials. Examples of the ferromagnetic materials include a metal selected from the group consisting of Cr, Mn, Co, Fe, and Ni, an alloy including one or more of these metals, an alloy including these metals and at least one element of B, C, and N, and the like. Examples of the ferromagnetic materials include Co—Fe, Co—Fe—B, Ni—Fe, a Co—Ho alloy, a Sm—Fe alloy, a Fe—Pt alloy, a Co—Pt alloy, and Co/Cr/Pt alloys.

The first ferromagnetic layer 1 and the second ferromagnetic layer 2 may include a Heusler alloy. The Heusler alloy includes an intermetallic compound having a chemical composition of XYZ or $X_2YZ$. X represents a Co—, Fe—, Ni—, or Cu— group transition metal element in the periodic table or a noble metal element, Y represents a Mn—, V—, Cr—, or Ti— group transition metal or an element of the X type, and Z represents a typical element from Group III to Group V. Examples of the Heusler alloy include $Co_2FeSi$, $Co_2FeGe$, $Co_2FeGa$, $Co_2MnSi$, $Co_2Mn_{1-a}Fe_aAl_bSi_{1-b}$, $Co_2FeGe_1-cGa_c$, and the like. The Heusler alloy has a high spin polarizability.

The laminated body 10 may have an antiferromagnetic layer on a surface of the second ferromagnetic layer 2 opposite to the non-magnetic layer 3 via a spacer layer. The second ferromagnetic layer 2, the spacer layer, and the antiferromagnetic layer are formed in a synthetic antiferromagnetic structure (an SAF structure). The synthetic antiferromagnetic structure is composed of two magnetic layers having a non-magnetic layer disposed therebetween. The antiferromagnetic coupling between the second ferromagnetic layer 2 and the antiferromagnetic layer increases the coercivity of the second ferromagnetic layer 2 as compared with a case in which the antiferromagnetic layer is not provided. The antiferromagnetic layer is made of, for example, IrMn, PtMn, or the like. The spacer layer includes, for example, at least one selected from the group consisting of Ru, Ir, and Rh.

The laminated body 10 may have a layer other than the first ferromagnetic layer 1, the second ferromagnetic layer 2, and the non-magnetic layer 3. For example, an underlayer may be provided between the spin orbit torque wiring 20 and the laminated body 10. The underlayer enhances the crystallinity of each of the layers forming the laminated body 10.

The spin orbit torque wiring 20 is, for example, in contact with a surface of the laminated body 10. The spin orbit torque wiring 20 is an example of a wiring and is a write wiring configured to write data in each of the magnetoresistance effect elements 100. For example, the length of the spin orbit torque wiring 20 in the x direction when viewed from the z direction is longer than that thereof in the y direction and the spin orbit torque wiring 20 extends in the x direction. The first ferromagnetic layer 1 is disposed between at least a part of the spin orbit torque wiring 20 and the non-magnetic layer 3 in the z direction.

The spin orbit torque wiring 20 generates a spin current due to the spin Hall effect when a current I flows and injects spins into the first ferromagnetic layer 1. The spin orbit torque wiring 20 applies, for example, a spin orbit torque (SOT) to the magnetization of the first ferromagnetic layer 1 to the extent that the magnetization of the first ferromagnetic layer 1 can be reversed. The spin Hall effect is a phenomenon in which a spin current is induced in a direction orthogonal to a direction in which a current flows on the basis of a spin-orbit interaction when the current flows. The spin Hall effect is the same as the normal Hall effect in that a moving (traveling) direction of moving (traveling) charges (electrons) can be bent. In the normal Hall effect, a moving direction of charged particles moving in a magnetic field is bent due to a Lorentz force. On the other hand, the spin Hall effect bends a traveling direction of spins only due to moving electrons (a flowing current) even in the absence of a magnetic field.

For example, if a current flows through the spin orbit torque wiring 20, a first spin oriented in one direction and a second spin oriented in a direction opposite to that of the first spin are bent due to the spin Hall effect in directions orthogonal to a direction in which a current I flows. For example, the first spin oriented in a −y direction is bent in a +z direction and the second spin oriented in a +y direction is bent in a −z direction.

In a non-magnetic material (a material which is not a ferromagnetic material), the number of electrons with the first spin and the number of electrons with the second spin generated due to the spin Hall effect are equal to each other. That is to say, the number of electrons of the first spin directed in +z direction and the number of electrons of the second spin directed in the −z direction are equal to each other. The first spin and the second spin flow in a direction in which an uneven distribution of spins is eliminated. In the movement of the first spin and the second spin in the z direction, flows of charge cancel each other out. Thus, an amount of current is zero. A spin current without a current is particularly referred to as a "pure spin current."

If a flow of electrons of the first spin is represented by J↑, a flow of electrons of the second spin is represented by J↓, and a spin current is represented by $J_S$, they are defined by $J_S=J↑−J↓$. A spin current $J_S$ is generated in the z direction. The first spin is injected from the spin orbit torque wiring 20 to the first ferromagnetic layer 1.

The spin orbit torque wiring 20 includes any of a metal, an alloy, an intermetallic compound, a metal boride, a metal carbide, a metal silicide, and a metal phosphide which have a function of generating a spin current due to the spin Hall effect when a current I flows.

The spin orbit torque wiring 20 contains, for example, a non-magnetic heavy metal as a main component. The heavy metal refers to a metal having a specific gravity equal to or higher than that of yttrium (Y). The non-magnetic heavy metal is, for example, a non-magnetic metal having a large atomic number with an atomic number of 39 or more having d electrons or f electrons in the outermost shell. The spin orbit torque wiring 20 includes, for example, Hf, Ta, and W. The non-magnetic heavy metal has a stronger spin-orbit interaction than other metals. The spin Hall effect is caused due to spin orbit interaction, spins are easily unevenly distributed in the spin orbit torque wiring 20, and the spin current $J_S$ is easily generated.

In addition to this, the spin orbit torque wiring 20 may include a magnetic metal. The magnetic metal is a ferromagnetic metal or an antiferromagnetic metal. A small amount of magnetic metal contained in the non-magnetic material is a cause of spin scattering. The small amount is, for example, 3% or less of a total of molar ratios of elements forming the spin orbit torque wiring 20. If spins are scattered due to the magnetic metal, the spin-orbit interaction is enhanced and the generation efficiency of a spin current with respect to the current is increased.

The spin orbit torque wiring 20 may include a topological insulator. The topological insulator is a substance in which the inside of the substance is an insulator or a high resistance substance, but a spin-polarized metal state occurs on a surface thereof. In the topological insulator, an internal magnetic field is caused due to a spin-orbit interaction. In the topological insulator, a new topological phase appears due to the effect of a spin-orbit interaction even without an external magnetic field. The topological insulator can generate a pure spin current with high efficiency due to a strong spin-orbit interaction and breaking of inversion symmetry at edges.

The topological insulator is, for example, SnTe, $Bi_{1.5}Sb_{0.5}Te_{1.7}Se_{1.3}$, $TlBiSe_2$, $Bi_2Te_3$, $Bi_{1-x}Sb_x$, $(Bi_{1-x}Sb_x)_2Te_3$, and the like. The topological insulator can generate a spin current with high efficiency.

The conductive layer 30 is on a side of the laminated body 10 opposite to the spin orbit torque wiring 20. The conductive layer 30 is, for example, in contact with the second ferromagnetic layer 2 of the laminated body 10. The conductive layer 30 is made of a material having conductivity. The conductive layer 30 includes, for example, any selected from the group consisting of Al, Cu, Ta, Ti, Zr, NiCr, and nitrides (for example, TiN, TaN, and SiN). The conductive layer 30 is, for example, a laminated body made of NiCr and Ta. The conductive layer 30 may function as a cap layer of the laminated body 10. Furthermore, the conductive layer 30 may function as a hard mask used in a process of manufacturing the magnetoresistance effect element 100.

The conductive layer 30 may be made of, for example, a transparent electrode material. The conductive layer 30 may include, for example, indium zinc oxide (IZO), indium tin oxide (ITO), tin oxide ($SnO_2$), an antimony oxide tin oxide type (ATO), zinc oxide (ZnO), fluorine-doped tin oxide (FTO), indium oxide ($In_2O_3$), or the like. If the conductive layer 30 is transparent, it is easy to read an orientation direction of the magnetization of the first ferromagnetic layer 1 or the second ferromagnetic layer 2 from the outside.

The heat dissipation layer 40 is separated from the laminated body 10, for example, in the x direction and the y direction. For example, the insulating layer 50 is provided between the heat dissipation layer 40 and the laminated body 10. The heat dissipation layer 40 connects the spin orbit torque wiring 20 and the conductive layer 30. The heat dissipation layer 40 is, for example, one continuous layer configured to surround the periphery of the laminated body 10. The heat dissipation layer 40 is a path through which heat generated in the spin orbit torque wiring 20 is released.

The heat dissipation layer 40 has thermal conductivity and insulation. The heat dissipation layer 40 has, for example, a higher thermal conductivity than the insulating layer 50. The heat dissipation layer 40 includes a material having insulation and having a higher thermal conductivity than a material forming the insulating layer 50. The heat dissipation layer 40 has, for example, an insulating property and is made of a material having higher thermal conductivity than the material forming the insulating layer 50. The heat dissipation layer 40 includes, for example, any selected from the group consisting of SiN, AlN, and MgO. For example, when the insulating layer 50 is made of $SiO_2$, the heat dissipation layer 40 may be made of SiN.

The insulating layer 50 is provided between the laminated body 10 and the heat dissipation layer 40. For example, the insulating layer 50 surrounds the periphery of the laminated body 10. For example, the insulating layer 50 is made of the same material as the insulating layer 90 described above.

The laminated body 10 is disposed between the first wiring 60 and the second wiring 70 in the x direction when viewed in a plan view from the z direction. The first wiring 60 and the second wiring 70 are wirings extending in the z direction. The first wiring 60, the second wiring 70, and the conductive sections Cw include materials having conductivity.

A method for manufacturing the magnetoresistance effect element 100 will be described below. The magnetoresistance effect element 100 is formed through a lamination process of each layer and a processing process of processing a part of each layer into a predetermined shape. For lamination of each layer, a sputtering method, a chemical vapor deposition (CVD) method, an electron beam evaporation method (an EB evaporation method), an atomic laser deposition method, or the like can be used. The processing of each layer can be performed using photolithography or the like.

First, impurities are doped at a predetermined position on a substrate Sub to form a source S and a drain D. Subsequently, a gate insulating film GI and a gate electrode G are formed between the source S and the drain D. The source S, the drain D, the gate insulating film GI, and the gate electrode G form a transistor Tr.

Subsequently, an insulating layer 90 is formed to cover the transistor Tr. Furthermore, the first wiring 60, the second wiring 70, and a conductive section Cw are formed by forming an opening portion in the insulating layer 90 and filling an inside of the opening portion with a conductor. A write wiring Wp and a common wiring Cm are formed by laminating the insulating layer 90 to a predetermined thickness, forming a groove in the insulating layer 90, and filling the groove with a conductor.

Subsequently, a wiring layer, a ferromagnetic layer, a non-magnetic layer, and a ferromagnetic layer are sequentially laminated on one surface of the insulating layer 90, the first wiring 60, and the second wiring 70. Subsequently, the wiring layer is processed into a predetermined shape. The wiring layer is processed into a predetermined shape to form the spin orbit torque wiring 20. Subsequently, the laminated body formed above the wiring layer is processed into a predetermined shape to obtain the laminated body 10. Subsequently, an insulating layer is laminated on the spin orbit torque wiring 20 and the laminated body 10. The insulating layer 50 is obtained by removing portions of the laminated insulating layer other than a portion thereof laminated on the spin orbit torque wiring 20 (including a portion thereof laminated on an upper surface of the laminated body 10). Subsequently, the conductive layer 30 is formed on the laminated body 10 and the insulating layer 50. Finally, the spin orbit torque wiring 20 and the conductive layer 30 are connected through the heat dissipation layer 40 by laminating the heat dissipation layer 40. After that, the other portions are filled with the insulating layer 90 to obtain the magnetoresistance effect element 100.

An operation of the magnetoresistance effect element 100 according to the first embodiment will be described below. The magnetoresistance effect element 100 has a data write operation and a data read operation.

An operation of recording data in the magnetoresistance effect element 100 will be first described. First, the first switching element 110 and the second switching element 120 connected to the magnetoresistance effect element 100 in which data is to be recorded are turned on. If the first switching element 110 and the second switching element 120 are turned on, a write current flows through the spin orbit torque wiring 20. If the write current flows through the spin orbit torque wiring 20, the spin Hall effect occurs and spins are injected into the first ferromagnetic layer 1. The spins injected into the first ferromagnetic layer 1 apply a spin orbit torque (SOT) to the magnetization of the first ferromagnetic layer 1 and change an orientation direction of the magnetization of the first ferromagnetic layer 1. If a direction in which a current flows is reversed, a direction of the spins injected into the first ferromagnetic layer 1 is reversed. Thus, it is possible to freely control an orientation direction of the magnetization.

A resistance value of the laminated body 10 in a lamination direction thereof is small when the magnetization of the first ferromagnetic layer 1 and the magnetization of the second ferromagnetic layer 2 are parallel to each other and is large when the magnetization of the first ferromagnetic layer 1 and the magnetization of the second ferromagnetic layer 2 are antiparallel to each other. Data is recorded in the magnetoresistance effect element 100 as a resistance value of the laminated body 10 in the lamination direction thereof.

An operation of reading data from the magnetoresistance effect element 100 will be described below. First, the first switching element 110 or the second switching element 120 and the third switching element 130 connected to the magnetoresistance effect element 100 in which data is to be recorded are turned on. If each switching element is set in this way, a read current flows in a direction in which the laminated body 10 is laminated. If a resistance value of the laminated body 10 in the lamination direction thereof differs in accordance with the Ohm's law, a voltage to be output differs. For this reason, for example, it is possible to read data recorded in the magnetoresistance effect element 100 by reading a voltage of the laminated body 10 in the lamination direction thereof.

The magnetoresistance effect element 100 according to the first embodiment can efficiently remove the heat generated in the spin orbit torque wiring 20 at the time of write operation and has excellent data stability. The reason for this will be described in detail below.

The spin orbit torque wiring 20 contains a heavy metal in many cases. The heavy metal has a large electrical resistance and serves as a heat source. The heat generated in the spin orbit torque wiring 20 reduces the stability of the magnetization of the magnetoresistance effect element 100 and causes the reliability of the stored data to decrease. Most of the generated heat is removed to the outside through the first wiring 60, the second wiring 70, and the conductive layer 30 which have excellent thermal conductivity. If a path for the heat from the spin orbit torque wiring 20 to the first wiring 60, the second wiring 70, or the conductive layer 30 is enhanced, the heat removal performance of the magnetoresistance effect element 100 is improved.

As one means for improving the heat removal performance, it is conceivable to increase thermal conductivity of the insulating layer 50 surrounding the periphery of the laminated body 10. However, in this case, the heat generated in the spin orbit torque wiring 20 reaches the conductive layer 30 through the insulating layer 50 and the heat passes through the vicinity of the laminated body 10. If the heat passes through the vicinity of the laminated body 10, there is a concern concerning the fact that the heat may reduce the stability of the magnetization of the first ferromagnetic layer 1 and the second ferromagnetic layer 2 and a magnetization direction may change. If a relative angle of magnetization between the first ferromagnetic layer 1 and the second ferromagnetic layer 2 changes, a resistance value of the laminated body 10 changes and data to be read is rewritten.

On the other hand, in the magnetoresistance effect element 100 according to the first embodiment, the heat dissipation layer 40 is arranged at a position distant from the laminated body 10. For this reason, the heat generated in the spin orbit torque wiring 20 is transmitted through the heat dissipation layer 40 separated from the laminated body 10 and it is possible to prevent magnetization directions of the first ferromagnetic layer 1 and the second ferromagnetic layer 2 from changing. That is to say, the magnetoresistance effect element 100 can stably hold data and has high reliability.

Here, as a path through which the heat generated in the spin orbit torque wiring 20 reaches the conductive layer 30, there are a first path R1 in which the heat passes through the laminated body 10 and a second path R2 in which the heat passes through the heat dissipation layer 40. For example, when a portion of a connection surface between the first wiring 60 and the spin orbit torque wiring 20 closest to the laminated body 10 in the x direction is assumed to be a first end portion 60E, it is desirable that the distance of the first path R1 from the first end portion 60E to the conductive layer 30 through the laminated body 10 be longer than a distance of the second path R2 from the first end portion 60E to the conductive layer 30 through the heat dissipation layer 40. If the second path R2 is shorter than the first path R1, most of the generated heat is transmitted through the second path R2 and it is possible to further minimize an influence of the heat on the laminated body 10. The first end portion 60E is a portion in which a current density sharply increases when a current flows from the first wiring 60 to the spin orbit torque wiring 20 and easily generates heat.

Similarly, for example, when a portion of a connection surface between the second wiring 70 and the spin orbit torque wiring 20 closest to the laminated body 10 in the x direction is assumed to be a first end portion 70E, it is desirable that a distance of a path from the first end portion 70E to the conductive layer 30 through the laminated body 10 be longer than a distance of a path from the first end portion 70E to the conductive layer 30 through the heat dissipation layer 40.

Second Embodiment

Figure 5:
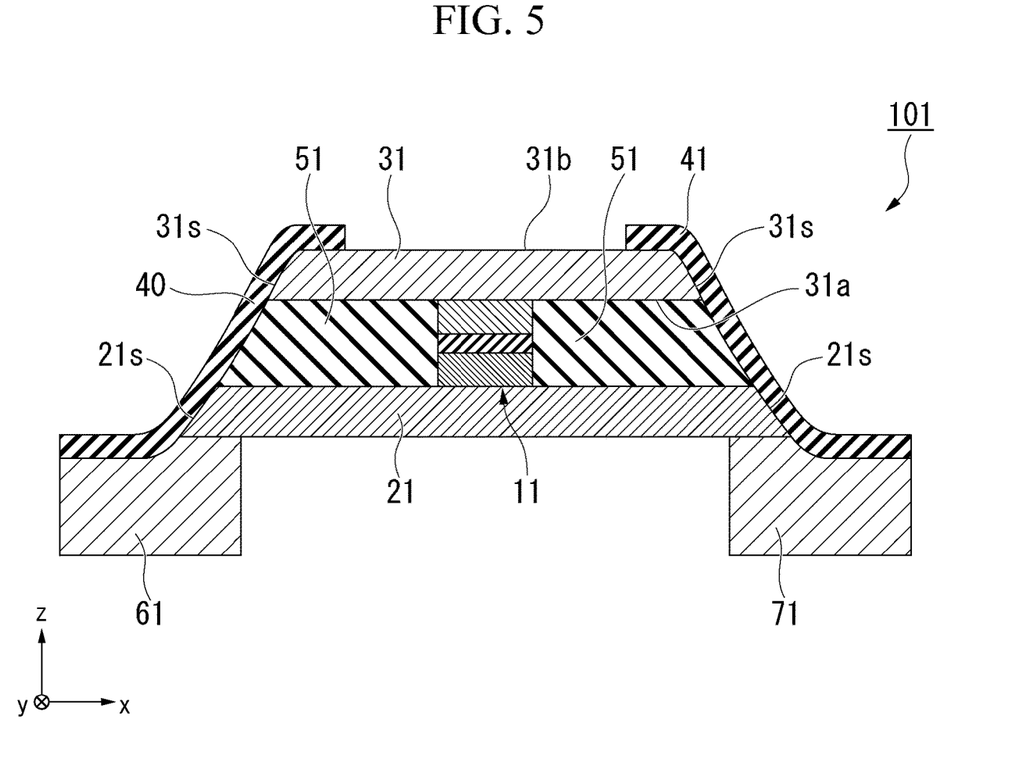
FIG. 5 is a cross-sectional view of a magnetoresistance effect element according to a second embodiment.
Figure 6:
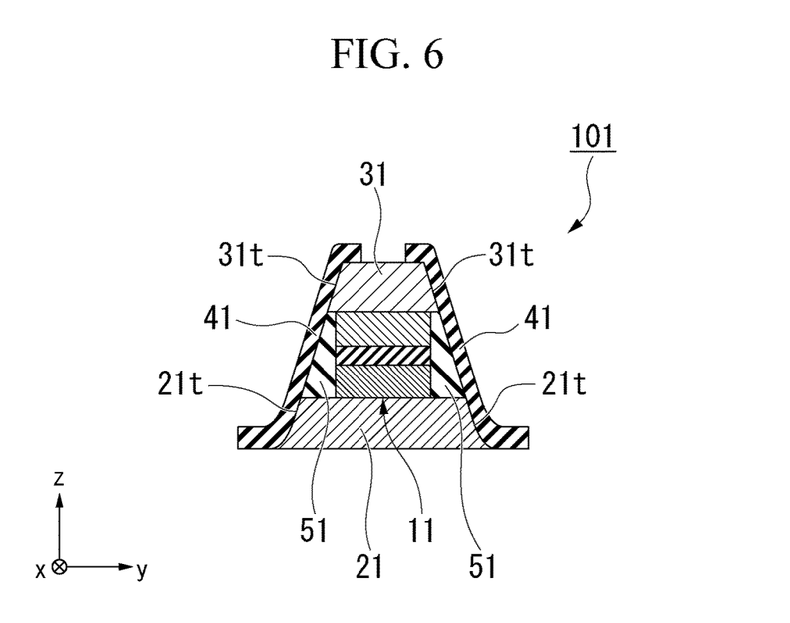
FIG. 6 is another cross-sectional view of the magnetoresistance effect element according to the second embodiment.

FIG. 5 is a cross-sectional view of a magnetoresistance effect element 101 according to a second embodiment. FIG. 6 is another cross-sectional view of the magnetoresistance effect element 101 according to the second embodiment. FIG. 5 is a cross section of the magnetoresistance effect element 101 taken along an xz plane passing through the center of the width of a spin orbit torque wiring 21 in the y direction. FIG. 6 is a cross section of the magnetoresistance effect element 101 taken along a yz plane passing through the center of the length of the spin orbit torque wiring 21 in the x direction.

The magnetoresistance effect element 101 according to the second embodiment includes a laminated body 11, a spin orbit torque wiring 21, a conductive layer 31, a heat dissipation layer 41, an insulating layer 51, a first wiring 61, and a second wiring 71.

The laminated body 11 is the same as the laminated body 10 according to the first embodiment. The spin orbit torque wiring 21, the conductive layer 31, the heat dissipation layer 41, the insulating layer 51, the first wiring 61, and the second wiring 71 are the same as the spin orbit torque wiring 20, the conductive layer 30, the heat dissipation layer 40, the insulating layer 50, the first wiring 60, and the second wiring 70 according to the first embodiment, except for shapes thereof. For this reason, the magnetoresistance effect element 101 according to the second embodiment has the same effect as the magnetoresistance effect element 100 according to the first embodiment.

The heat dissipation layer 41 is inclined with respect to the z direction. Contact surfaces $21s$ and $21t$ between the heat dissipation layer 41 and the spin orbit torque wiring 21 are inclined with respect to the z direction. Furthermore, contact surfaces $31s$ and $31t$ between the heat dissipation layer 41 and the conductive layer 31 are inclined with respect to the z direction. If the contact surfaces $21s$, $21t$, $31s$, and $31t$ are inclined with respect to the z direction, contact areas thereof increase, as compared with a case in which the contact surfaces 21s, 21t, 31s, and 31t are not inclined with respect to the z direction. If the contact areas with respect to the heat dissipation layer 41 are increased, the heat dissipation efficiency is improved.

Also, the heat dissipation layer 41 is in contact with the first wiring 61 and the second wiring 71. When the processing in the x direction when the spin orbit torque wiring 20 is prepared is performed, if the spin orbit torque wiring 21 is over-etched, the first wiring 61 and the second wiring 71 are exposed and the heat dissipation layer 41 is in contact with the first wiring 61 and the second wiring 71. Since the first wiring 61 and the second wiring 71 also have excellent thermal conductivity, there is a path of the heat which is directly transmitted from the heat dissipation layer 41 to the first wiring 61 and the second wiring 71. Thus, it is possible to further improve the heat dissipation efficiency.

Also, the heat dissipation layer 41 covers a part of a second surface 31b of the conductive layer 31. The second surface 31b is a surface on a side opposite to a first surface 31a and the first surface 31a is a surface in contact with the laminated body 10. Since the heat dissipation layer 41 is in contact with the second surface 31b of the conductive layer 31, a contact area between the heat dissipation layer 41 and the conductive layer 31 is increased and the heat dissipation efficiency is further improved.

Third Embodiment

Figure 7:
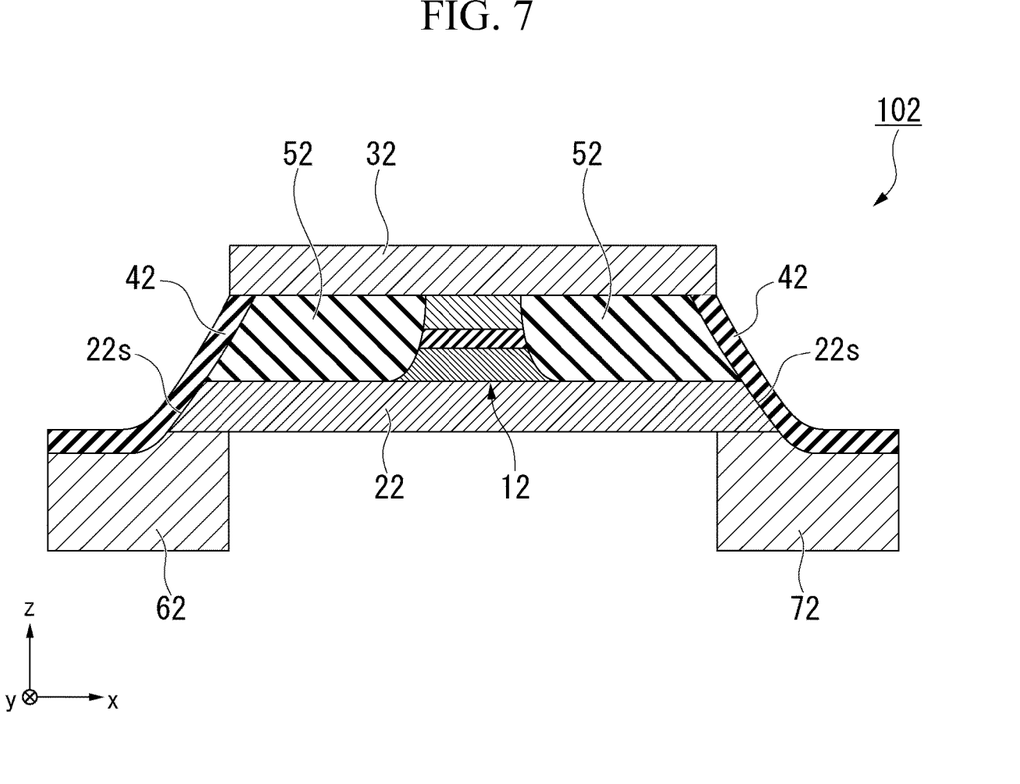
FIG. 7 is a cross-sectional view of a magnetoresistance effect element according to a third embodiment.
Figure 8:
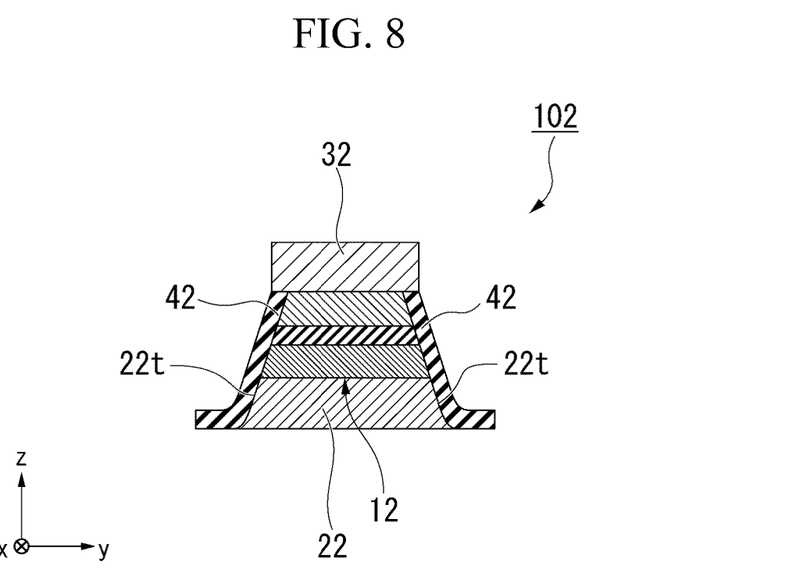
FIG. 8 is another cross-sectional view of the magnetoresistance effect element according to the third embodiment.

FIG. 7 is a cross-sectional view of a magnetoresistance effect element 102 according to a third embodiment. FIG. 8 is another cross-sectional view of the magnetoresistance effect element 102 according to the third embodiment. FIG. 7 is a cross section of the magnetoresistance effect element 102 taken along an xz plane passing through the center of the width of a spin orbit torque wiring 22 in the y direction. FIG. 8 is a cross section of the magnetoresistance effect element 102 taken along a yz plane passing through the center of the length of the spin orbit torque wiring 22 in the x direction.

The magnetoresistance effect element 102 according to the third embodiment includes a laminated body 12, a spin orbit torque wiring 22, a conductive layer 32, a heat dissipation layer 42, an insulating layer 52, a first wiring 62, and a second wiring 72.

The laminated body 12, the spin orbit torque wiring 22, the conductive layer 32, the heat dissipation layer 42, the insulating layer 52, the first wiring 62, and the second wiring 72 are the same as the spin orbit torque wiring 20, the conductive layer 30, the heat dissipation layer 40, the insulating layer 50, the first wiring 60, and the second wiring 70 according to the first embodiment, except for shapes thereof. For this reason, the magnetoresistance effect element 102 according to the third embodiment has the same effect as the magnetoresistance effect element 100 according to the first embodiment.

The heat dissipation layer 42 is inclined with respect to the z direction. Contact surfaces 22s and 22t between the heat dissipation layer 42 and the spin orbit torque wiring 22 are inclined with respect to the z direction.

The laminated body 12 is in contact with the heat dissipation layer 42 in the y direction. In this case, the heat reaching the conductive layer 32 through the heat dissipation layer 42 passes through the vicinity of the laminated body 12 in the y direction. However, it is important that the heat generated at a position distant from the laminated body 12 passes through the heat dissipation layer 42 without passing through the vicinity of the laminated body 12. Since the heat generated in the vicinity of the laminated body 10 originally passes through the inside of the laminated body 10 having excellent thermal conductivity and hardly reaches the heat dissipation layer 42, the heat dissipation layer 42 may be in contact with the laminated body 12 in the y direction. If the laminated body 12 and the heat dissipation layer 42 are separated in the x direction, the effect of increasing the thermal stability of the magnetoresistance effect element 102 can be obtained.

Also, the conductive layer 32 is formed above the heat dissipation layer 42, the insulating layer 52, and the laminated body 12. The magnetoresistance effect element 102 according to the third embodiment is obtained by forming the heat dissipation layer 42 before the conductive layer 32 is laminated.

Fourth Embodiment

Figure 9:
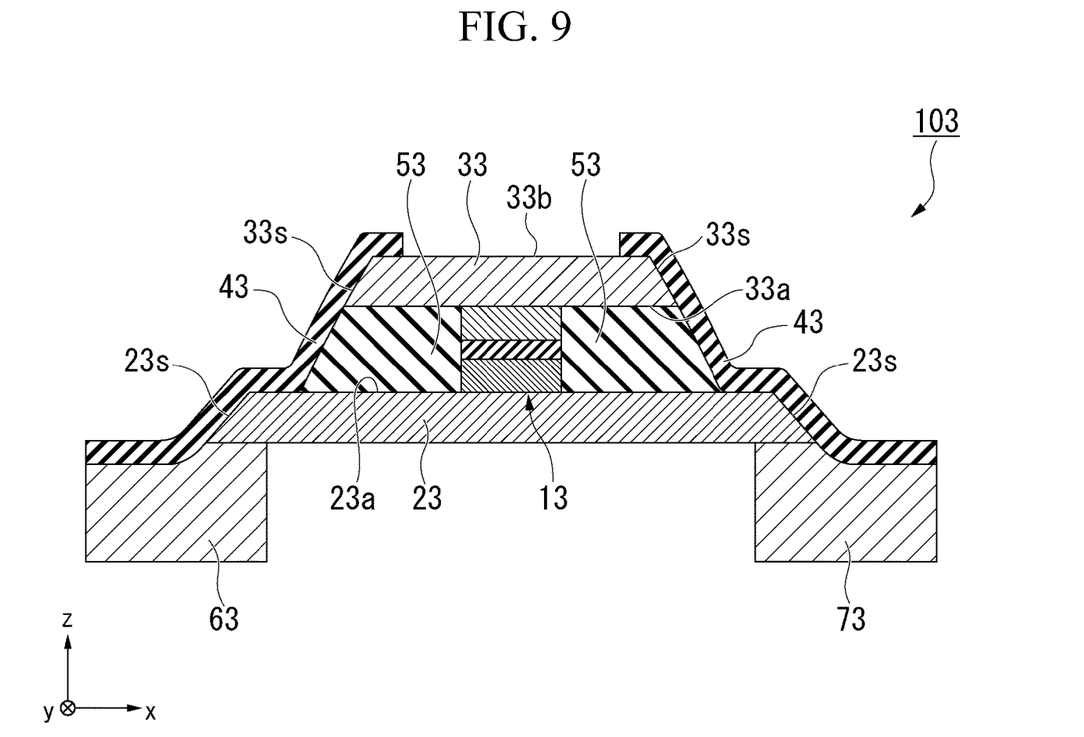
FIG. 9 is a cross-sectional view of a magnetoresistance effect element according to a fourth embodiment.
Figure 10:
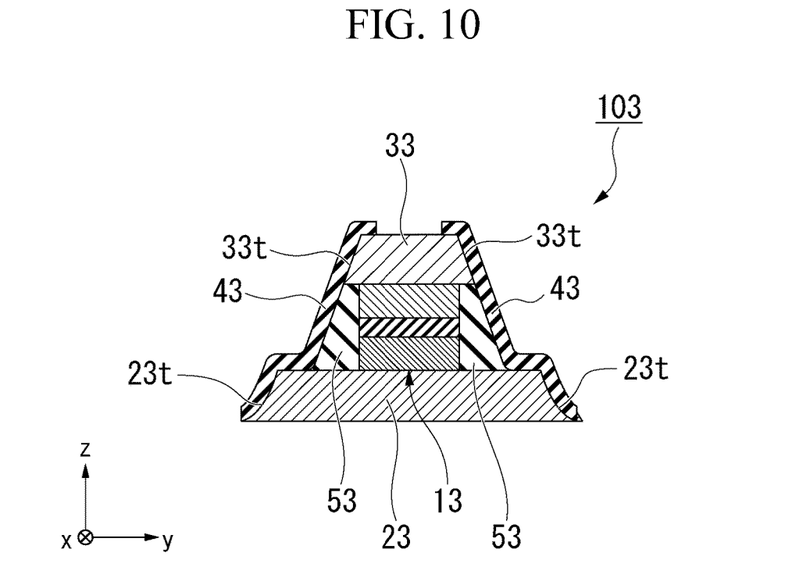
FIG. 10 is another cross-sectional view of the magnetoresistance effect element according to the fourth embodiment.

FIG. 9 is a cross-sectional view of a magnetoresistance effect element 103 according to a fourth embodiment. FIG. 10 is another cross-sectional view of the magnetoresistance effect element 103 according to the fourth embodiment. FIG. 9 is a cross section of the magnetoresistance effect element 103 taken along an xz plane passing through the center of a width of a spin orbit torque wiring 23 in the y direction. FIG. 10 is a cross section of the magnetoresistance effect element 103 taken along a yz plane passing through the center of the length of the spin orbit torque wiring 23 in the x direction.

The magnetoresistance effect element 103 according to the fourth embodiment includes a laminated body 13, a spin orbit torque wiring 23, a conductive layer 33, a heat dissipation layer 43, an insulating layer 53, a first wiring 63, and a second wiring 73.

The laminated body 13, the spin orbit torque wiring 23, the conductive layer 33, the heat dissipation layer 43, the insulating layer 53, the first wiring 63, and the second wiring 73 are the same as the spin orbit torque wiring 20, the conductive layer 30, the heat dissipation layer 40, the insulating layer 50, the first wiring 60, and the second wiring 70 according to the first embodiment, except for shapes thereof. For this reason, the magnetoresistance effect element 103 according to the fourth embodiment has the same effect as the magnetoresistance effect element 100 according to the first embodiment.

A part of the heat dissipation layer 43 is inclined with respect to the z direction. Contact surfaces 23s and 23t between the heat dissipation layer 43 and the spin orbit torque wiring 23 are inclined with respect to the z direction. Contact surfaces 33s and 33t between the heat dissipation layer 43 and the conductive layer 33 are inclined with respect to the z direction.

Also, the heat dissipation layer 43 has a step shape having a terrace along an xy plane and a step erected with respect to the xy plane. The heat dissipation layer 43 is in contact with a first surface 23a of the spin orbit torque wiring 23. The first surface 23a is a surface in contact with the laminated body 13 of the spin orbit torque wiring 23. Since the heat dissipation layer 43 is in contact with the first surface 23a of the spin orbit torque wiring 23, a contact area between the heat dissipation layer 43 and the spin orbit torque wiring 23 is increased and the heat dissipation efficiency is further improved.

Fifth Embodiment

Figure 11:
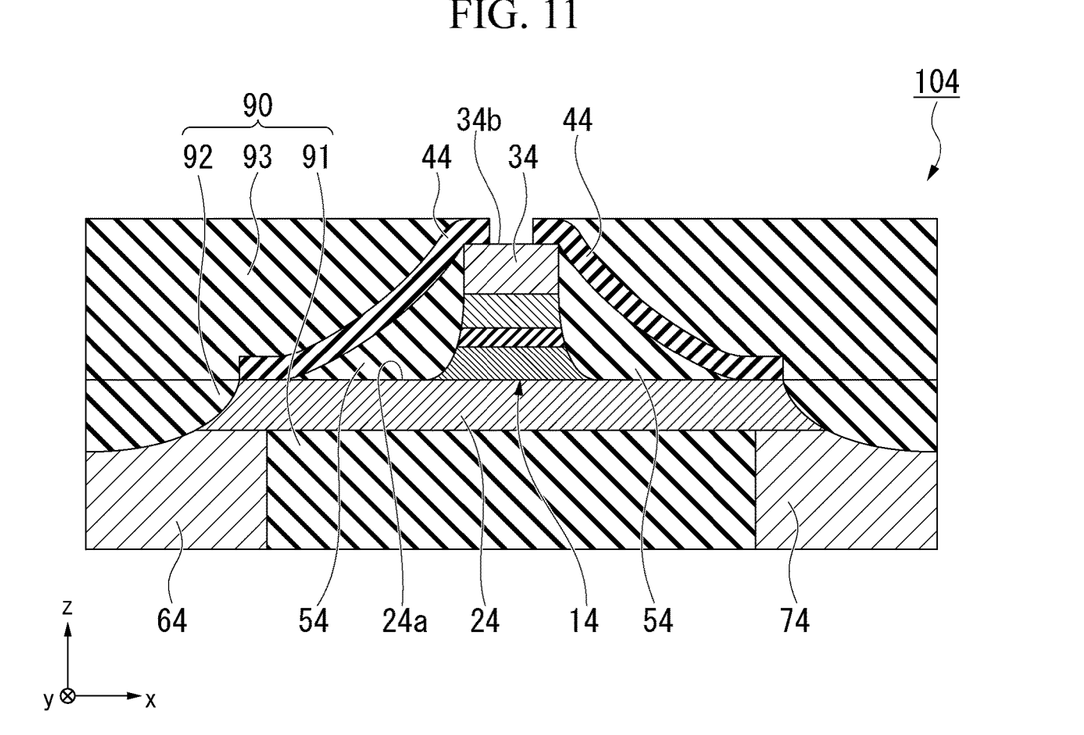
FIG. 11 is a cross-sectional view of a magnetoresistance effect element according to a fifth embodiment.
Figure 12:
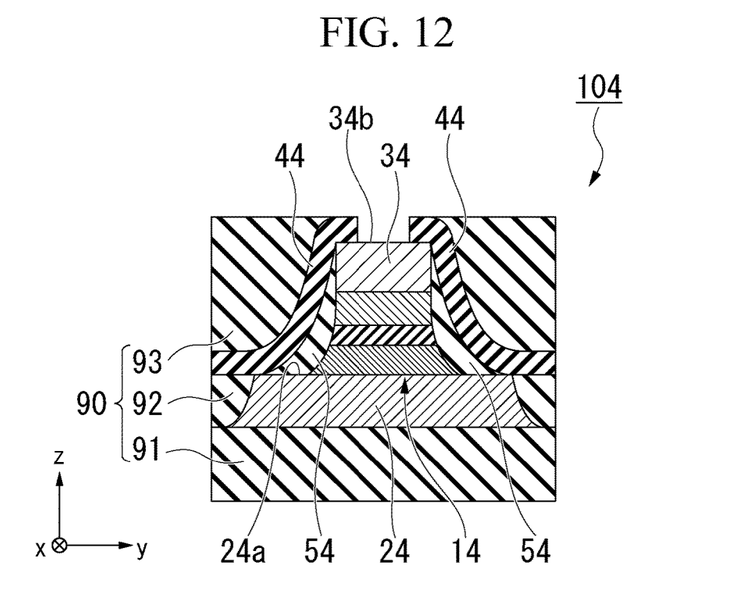
FIG. 12 is another cross-sectional view of the magnetoresistance effect element according to the fifth embodiment.

FIG. 11 is a cross-sectional view of a magnetoresistance effect element 104 according to a fifth embodiment. FIG. 12 is another cross-sectional view of the magnetoresistance effect element 104 according to the fifth embodiment. FIG. 11 is a cross section of the magnetoresistance effect element 104 taken along an xz plane passing through the center of the width of a spin orbit torque wiring 24 in the y direction. FIG. 12 is a cross section of the magnetoresistance effect element 104 taken along a yz plane passing through the center of the length of the spin orbit torque wiring 24 in the x direction.

The magnetoresistance effect element 104 according to the fifth embodiment includes a laminated body 14, a spin orbit torque wiring 24, a conductive layer 34, a heat dissipation layer 44, an insulating layer 54, a first wiring 64, and a second wiring 74. Furthermore, FIGS. 11 and 12 both illustrate an insulating layer 90 surrounding the periphery of the magnetoresistance effect element 104. The insulating layer 90 includes an insulating layer 91, an insulating layer 92, and an insulating layer 93.

The laminated body 14, the spin orbit torque wiring 24, the conductive layer 34, the heat dissipation layer 44, the insulating layer 54, the first wiring 64, and the second wiring 74 are the same as the spin orbit torque wiring 20, the conductive layer 30, the heat dissipation layer 40, the insulating layer 50, the first wiring 60, and the second wiring 70 according to the first embodiment, except for shapes thereof. The heat dissipation layer 44 is in contact with a first surface 24a of the spin orbit torque wiring 24 and a second surface 34b of the conductive layer 34.

The magnetoresistance effect element 104 according to the fifth embodiment is prepared through the following procedure. First, the first wiring 64 and the second wiring 74 are formed by providing an opening in the insulating layer 91 and filling the opening with a conductor. Subsequently, a wiring layer is laminated on the insulating layer 91, the first wiring 64, and the second wiring 74. Subsequently, the wiring layer is processed in the x direction and the y direction and the spin orbit torque wiring 24 is formed. When the wiring layer is processed in the x direction, end portions of the first wiring 64 and the second wiring 74 are removed through overetching.

Subsequently, the periphery of the spin orbit torque wiring 24 is covered with the insulating layer 92. After that, an upper surface of the insulating layer 92 and an upper surface of the spin orbit torque wiring 24 are flattened through chemical mechanical polishing (CMP). Subsequently, a ferromagnetic layer, a non-magnetic layer, and a ferromagnetic layer are laminated on the insulating layer 92 and the spin orbit torque wiring 24. Moreover, a hard mask layer is formed at a predetermined position above the ferromagnetic layer. The laminated body 14 is obtained by processing the ferromagnetic layer, the non-magnetic layer, and the ferromagnetic layer which have been laminated using the hard mask layer as a mask. The hard mask layer serves as the conductive layer 34.

Subsequently, the insulating layer 54, the heat dissipation layer 44, and the insulating layer 93 are sequentially laminated to cover the conductive layer 34, the spin orbit torque wiring 24, and the insulating layer 92. Finally, an opening used for forming an electrode to be electrically connected to the conductive layer 34 is formed at a position in which the opening and the conductive layer 34 overlap when viewed from the z direction.

The magnetoresistance effect element 104 according to the fifth embodiment also has the same effect as the magnetoresistance effect element 100 according to the first embodiment.

Sixth Embodiment

Figure 13:
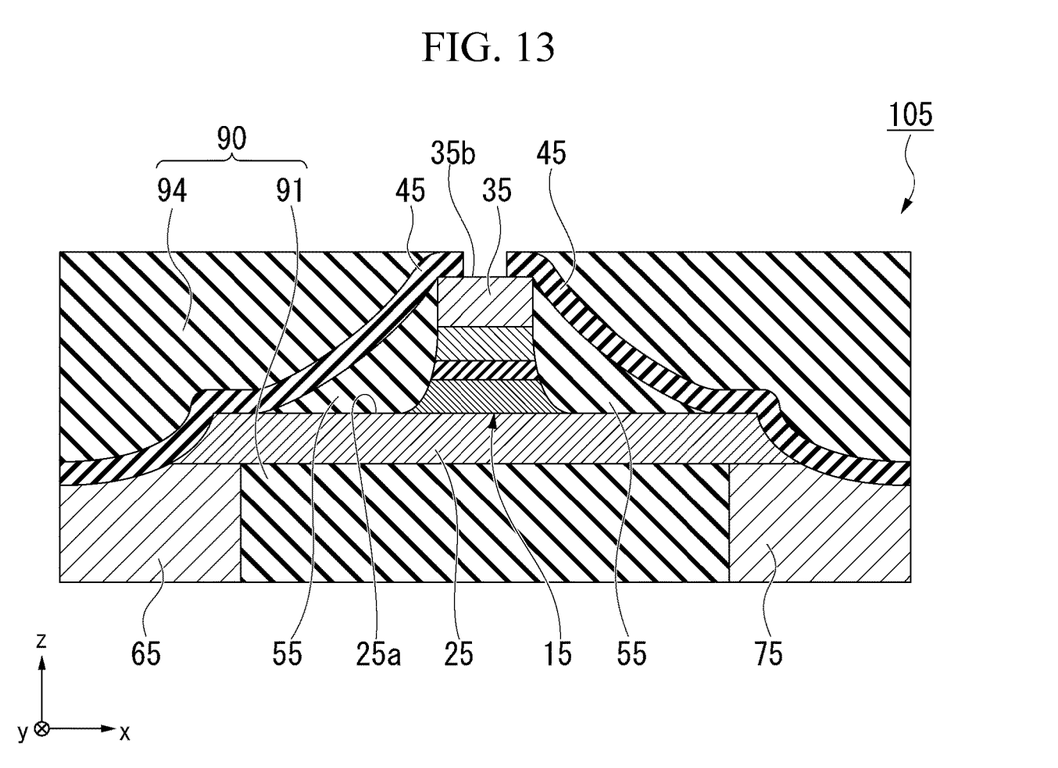
FIG. 13 is a cross-sectional view of a magnetoresistance effect element according to a sixth embodiment.
Figure 14:
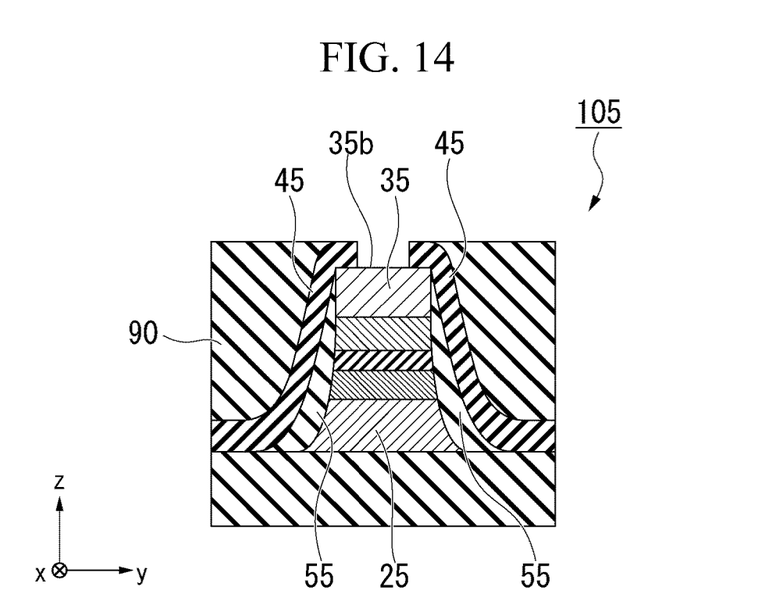
FIG. 14 is another cross-sectional view of the magnetoresistance effect element according to the sixth embodiment.

FIG. 13 is a cross-sectional view of a magnetoresistance effect element 105 according to a sixth embodiment. FIG. 14 is another cross-sectional view of the magnetoresistance effect element 105 according to the sixth embodiment. FIG. 13 is a cross section of the magnetoresistance effect element 105 taken along an xz plane passing through the center of the width of a spin orbit torque wiring 25 in the y direction. FIG. 14 is a cross section of the magnetoresistance effect element 105 taken along a yz plane passing through the center of the length of the spin orbit torque wiring 25 in the x direction.

The magnetoresistance effect element 105 according to the sixth embodiment includes a laminated body 15, a spin orbit torque wiring 25, a conductive layer 35, a heat dissipation layer 45, an insulating layer 55, a first wiring 65, and a second wiring 75. Furthermore, FIGS. 13 and 14 both illustrate an insulating layer 90 surrounding the periphery of the magnetoresistance effect element 105. The insulating layer 90 includes an insulating layer 91 and an insulating layer 94.

The laminated body 15, the spin orbit torque wiring 25, the conductive layer 35, the heat dissipation layer 45, the insulating layer 55, the first wiring 65, and the second wiring 75 are the same as the spin orbit torque wiring 20, the conductive layer 30, the heat dissipation layer 40, the insulating layer 50, the first wiring 60, and the second wiring 70 according to the first embodiment, except for shapes thereof. The heat dissipation layer 45 is in contact with a first surface 25a of the spin orbit torque wiring 25 and a second surface 35b of the conductive layer 35.

The magnetoresistance effect element 105 according to the sixth embodiment is prepared in the following procedure. First, the first wiring 64 and the second wiring 74 are formed by providing an opening in the insulating layer 91 and filling the opening with a conductor. Subsequently, a wiring layer, a ferromagnetic layer, a non-magnetic layer, and a ferromagnetic layer are laminated on the insulating layer 91, the first wiring 64, and the second wiring 74. Subsequently, a hard mask layer having the same shape as that of the spin orbit torque wiring 25 to be prepared is formed on an upper surface of the ferromagnetic layer and the wiring layer, the ferromagnetic layer, the non-magnetic layer, and the ferromagnetic layer are processed at one time. End portions of the first wiring 65 and the second wiring 75 are removed through overetching.

Subsequently, a part of the hard mask layer in the x direction is removed. Subsequently, the laminated body 15 is obtained by processing a shape in the x direction of the ferromagnetic layer, the non-magnetic layer, and the ferromagnetic layer which have been laminated using a hard mask layer whose shape has been processed as a mask. The hard mask layer which has been processed serves as the conductive layer 35.

Subsequently, the insulating layer 55, the heat dissipation layer 45, and the insulating layer 94 are sequentially laminated to cover the conductive layer 35 and the spin orbit torque wiring 25. Finally, an opening used for forming an electrode to be electrically connected to the conductive layer 35 is formed at a position in which the opening and the conductive layer 35 overlap when viewed from the z direction.

The magnetoresistance effect element 105 according to the sixth embodiment also has the same effect as the magnetoresistance effect element 100 according to the first embodiment.

Although the preferred embodiments of the present invention have been exemplified above on the basis of the first embodiment to the sixth embodiment, the present invention is not limited to these embodiments. For example, the characteristic constitution of each of the embodiments may be applied to other embodiments.

REFERENCE SIGNS LIST

1 First ferromagnetic layer
2 Second ferromagnetic layer
3 Non-magnetic layer
10, 11, 12, 13, 14, 15 Laminated body
20, 21, 22, 23, 24, 25 Spin orbit torque wiring
30, 31, 32, 33, 34, 35 Conductive layer
40, 41, 42, 43, 44, 45 Heat dissipation layer
50, 51, 52, 53, 54, 55, 90, 91, 92, 93, 94 Insulating layer
60, 61, 62, 63, 64, 65 First wiring
70, 71, 72, 73, 74, 75 Second wiring
21s, 21t, 22s, 22t, 23s, 23t, 31s, 31t, 33s, 33t Contact surface
23a, 24a, 25a, 31a First surface
31b, 34b, 35b Second surface
60E, 70E First end portion
100, 101, 102, 103, 104, 105 Magnetoresistance effect element
110 First switching element
120 Second switching element
130 Third switching element
200 Magnetic recording array
Cm1 to Cmn Common wiring
Cw Conductive section
D Drain
G Gate electrode
GI Gate insulating film
Rp1 to Rpn Read wiring
R1 First path
R2 Second path
S Source
Sub Substrate
Tr Transistor
Wp1 to Wpn Write wiring

What is claimed is:

1. A magnetoresistance effect element, comprising:
a spin orbit torque wiring extending in a first direction;
a laminated body laminated on the spin orbit torque wiring and having a first ferromagnetic layer, a second ferromagnetic layer, and a non-magnetic layer between the first ferromagnetic layer and the second ferromagnetic layer;
a conductive layer in contact with a side of the laminated body opposite to the spin orbit torque wiring; and
a heat dissipation layer separated from the laminated body in the first direction and directly connected to the spin orbit torque wiring and the conductive layer.

2. The magnetoresistance effect element according to claim 1, further comprising:
an insulating layer between the laminated body and the heat dissipation layer,
wherein a thermal conductivity of the heat dissipation layer is higher than a thermal conductivity of the insulating layer.

3. The magnetoresistance effect element according to claim 1, wherein, when viewed in a plan view from a direction in which the laminated body is laminated, the heat dissipation layer is separated from the laminated body in a second direction intersecting with the first direction.

4. The magnetoresistance effect element according to claim 1, further comprising:
a first wiring and a second wiring having the laminated body arranged therebetween in the first direction when viewed in a plan view from a direction in which the laminated body is laminated and connected to the spin orbit torque wiring.

5. The magnetoresistance effect element according to claim 4, wherein the heat dissipation layer is in direct contact with the first wiring and the second wiring.

6. The magnetoresistance effect element according to claim 4, wherein a distance of a first path from an end portion of the first wiring in the first direction to the conductive layer via the laminated body is longer than a distance of a second path from the end portion to the conductive layer via the heat dissipation layer.

7. The magnetoresistance effect element according to claim 1, wherein the heat dissipation layer includes any selected from the group consisting of SiN, AlN, and MgO.

8. The magnetoresistance effect element according to claim 1, wherein a contact surface between the heat dissipation layer and the spin orbit torque wiring is inclined with respect to a direction in which the laminated body is laminated.

9. The magnetoresistance effect element according to claim 1, wherein the heat dissipation layer covers a part of a surface of the conductive layer opposite to a surface thereof in contact with the laminated body.

10. The magnetoresistance effect element according to claim 1, wherein the heat dissipation layer is in contact with a surface of the spin orbit torque wiring in direct contact with the laminated body.

11. The magnetoresistance effect element according to claim 1, wherein the heat dissipation layer is one continuous layer.

12. A magnetic recording array, comprising:
a plurality of the magnetoresistance effect elements according to claim 1.

* * * * *